United States Patent
Tanaka

(10) Patent No.: US 10,340,081 B2
(45) Date of Patent: Jul. 2, 2019

(54) CERAMIC CAPACITOR

(71) Applicant: Murata Manufacturing Co., Ltd., Nagaokakyo-shi, Kyoto-fu (JP)

(72) Inventor: Yuichiro Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 3 days.

(21) Appl. No.: 15/607,767

(22) Filed: May 30, 2017

(65) Prior Publication Data

US 2017/0345566 A1  Nov. 30, 2017

(30) Foreign Application Priority Data

May 31, 2016 (JP) .................................. 2016-108584

(51) Int. Cl.

| H01G 4/12 | (2006.01) |
|---|---|
| H01G 4/30 | (2006.01) |
| C23C 14/18 | (2006.01) |
| C23C 14/34 | (2006.01) |
| H01G 4/005 | (2006.01) |
| H01G 4/232 | (2006.01) |

(52) U.S. Cl.
CPC ......... *H01G 4/1209* (2013.01); *C23C 14/185* (2013.01); *H01G 4/005* (2013.01); *H01G 4/232* (2013.01); *C23C 14/34* (2013.01); *H01G 4/302* (2013.01); *H01G 4/306* (2013.01)

(58) Field of Classification Search
CPC ...... H01G 4/1209; H01G 4/005; H01G 4/302; H01G 4/306; C23C 14/34

USPC ....................................................... 361/306.3
See application file for complete search history.

(56) References Cited

U.S. PATENT DOCUMENTS

| 6,547,879 B1 | 4/2003 | Chiba et al. | |
|---|---|---|---|
| 2002/0149438 A1* | 10/2002 | Isoda | H01P 1/387 333/1.1 |
| 2013/0234293 A1* | 9/2013 | Kawamoto | B82Y 30/00 257/602 |
| 2015/0109718 A1* | 4/2015 | Choi | H01G 2/06 361/304 |
| 2016/0189867 A1* | 6/2016 | Zaima | H01G 4/30 361/301.4 |
| 2016/0240319 A1* | 8/2016 | Onoue | H01G 4/35 |

FOREIGN PATENT DOCUMENTS

| JP | 10-154632 A | 6/1998 |
|---|---|---|
| JP | 10-294239 A | 11/1998 |
| JP | 2001-102243 A | 4/2001 |
| JP | 2001-155962 A | 6/2001 |

(Continued)

OTHER PUBLICATIONS

Shimada, "Ceramic Capacitor," U.S. Appl. No. 15/608,126, filed May 30, 2017.

(Continued)

*Primary Examiner* — Michael P McFadden
(74) *Attorney, Agent, or Firm* — Keating & Bennett, LLP

(57) ABSTRACT

A ceramic capacitor which is low in ESL and suitable for being built into a substrate includes a first external electrode, a second external electrode and a third external electrode. Each of the first, second and third external electrodes include a sputtering electrode film. Each of the outermost layers of the first, second and third external electrodes contains Cu.

19 Claims, 9 Drawing Sheets

(56) References Cited

FOREIGN PATENT DOCUMENTS

| JP | 2001-167989 A | 6/2001 |
| JP | 2003-007575 A | 1/2003 |
| JP | 2012-114457 A | 6/2012 |

OTHER PUBLICATIONS

Usui, "Ceramic Capacitor," U.S. Appl. No. 15/608,149, filed May 30, 2017.
Asai, "Ceramic Capacitor," U.S. Appl. No. 15/607,762, filed May 30, 2017.
Usui, "Ceramic Capacitor," U.S. Appl. No. 15/607,763, filed May 30, 2017.

* cited by examiner

CERAMIC CAPACITOR

CROSS REFERENCE TO RELATED APPLICATIONS

This application claims the benefit of priority to Japanese Patent Application No. 2016-108584 filed on May 31, 2016. The entire contents of this application are hereby incorporated herein by reference.

BACKGROUND OF THE INVENTION

1. Field of the Invention

The present invention relates to a ceramic capacitor.

2. Description of the Related Art

In recent years, the demand for miniaturization and thinning of information terminal devices such as mobile phones and mobile music players is increasing. Associated with this, downsizing is also increasingly required in substrates to be installed in electronic devices and electronic components to be installed in substrates. High density mounting of electronic components to be mounted on a substrate is also increasingly required. In order to further downsize electronic components, a built-in electronic component substrate in which an electronic component is embedded has been developed (e.g., Japanese Patent Application Laid-Open No. 2012-114457). In the built-in electronic component substrate, the electronic component-embedded in the substrate needs to be surely electrically connected to a wiring formed on the substrate.

Further, in a situation in which information amounts of electronic devices are increasing, frequency of usage of electronic devices in a further high-frequency area has increased. Therefore, there is a desire of making it possible to use the built-in electronic component substrate in a high-frequency area by reducing an equivalent series inductance (ESL) of an electronic component built in the built-in electronic component substrate.

For example, Japanese Patent Application Laid-Open No. 2001-155962 and Japanese Patent Application Laid-Open No. 2001-102243 suggest a multi-terminal capacitor such as three-terminal capacitor to reduce ESL. However, the multi-terminal capacitors described in Japanese Patent Application Laid-Open No. 2001-155962 and Japanese Patent Application Laid-Open No. 2001-102243 do not consider embedding in a substrate and electrical connection to wirings formed on the substrate. Therefore, it is difficult to suitably embed the multi-terminal capacitors described in Japanese Patent Application Laid-Open No. 2001-155962 and Japanese Patent Application Laid-Open No. 2001-102243 in a substrate. In other words, multi-terminal capacitors described in Japanese Patent Application Laid-Open No. 2001-155962 and Japanese Patent Application Laid-Open No. 2001-102243 are not suitable for being embedded in a substrate.

Further, external electrodes constituting ground terminals described in Japanese Patent Application Laid-Open No. 2001-155962 and Japanese Patent Application Laid-Open No. 2001-102243 are composed of fired electrodes. The fired electrode can be formed, for example, by a roller coating method as described in Japanese Patent Application Laid-Open No. 2001-167989. Specifically, using a roller having a groove for a conductive paste formed on a peripheral surface of the roller, a conductive paste held by the roller is transferred to apply the conductive paste onto a surface of a ceramic base body, and the applied paste is fired, and thereby a fired electrode can be formed. As described above, the fired electrode can be generally formed by a roller coating method. However, in this case, when the conductive paste is applied onto a side surface of the ceramic base body, the conductive paste also runs on a principal surface of the ceramic base body. As a result of this, the conductive paste that runs on from the side surface is applied onto a coating film having applied onto the principal surface of the ceramic base body. Thus, a portion on a side-surface side of the fired electrode is higher in thickness than another portion. Accordingly, when the ground terminal is formed from one side surface to the other side surface so as to extend over the principal surface, flatness of the external electrode may be impaired. When such a multilayer ceramic capacitor is embedded in the built-in electronic component substrate, there is a possibility that the electrical connection between the external electrodes and the via hole electrodes is deteriorated. Accordingly, there is a possibility that defective connection between the multilayer ceramic capacitor and the built-in electronic component substrate occurs.

SUMMARY OF THE INVENTION

Preferred embodiments of the present invention provide a ceramic capacitor which is low in ESL and is suitable for being built into a substrate.

A ceramic capacitor according to a preferred embodiment of the present invention includes a capacitor main body, a plurality of internal electrodes, and a plurality of external electrodes. The capacitor main body includes first and second principal surfaces, first and second side surfaces, and first and second end surfaces. The first and second principal surfaces extend in the length direction and the width direction. The width direction is perpendicular or substantially perpendicular to the length direction L. The first and second side surfaces extend in the length direction and the laminating direction. The laminating direction is perpendicular or substantially perpendicular to each of the length direction and the width direction. The first and second end surfaces extend in the width direction and the laminating direction. A plurality of internal electrodes are disposed in the capacitor main body. The plurality of internal electrodes are exposed at each of the first and second side surfaces. A plurality of external electrodes extend over from exposed portions of the internal electrodes at the first side surface and exposed portions of the internal electrodes at the second side surface to the first and second principal surfaces. A plurality of internal electrodes include first internal electrodes and second internal electrodes. The second internal electrodes are opposed to the first internal electrodes in the laminating direction. The first internal electrodes include a first opposed portion, first and second extended portions, and third and fourth extended portions. The first opposed portion is opposed to the second internal electrode. The first and the second extended portions are connected to the first opposed portion. The first and the second extended portions are extended to the first side surface. The third and the fourth extended portions are connected to the first opposed portion. The third and the fourth extended portions are extended to the second side surface. The second internal electrodes include the fifth extended portion and the sixth extended portion. The second opposed portion is opposed to the first opposed portion. The fifth extended portion is connected to the second opposed portion. The fifth extended portion is extended to the first side surface. The sixth extended portion is connected to the second opposed portion. The sixth extended portion is extended to the second side surface. A plurality of external electrodes include a first external electrode, a second external electrode and a third external electrode. The first external electrode covers an exposed portion of the first extended portion at the first side surface and an exposed portion of the third extended portion at the second side surface, and wraps around the first side surface, the first principal surface, the second side surface, and the second principal surface. The second external electrode covers an exposed portion of the second extended portion at the first side surface and an exposed portion of the fourth extended portion at the second side surface, and wraps around the first side surface, the first principal surface, the second side surface, and the second principal surface. The third external electrode covers an exposed portion of the fifth extended portion at the first side surface and an exposed portion of the sixth extended portion at the second side surface, and wraps around the first side surface, the first principal surface, the second side surface, and the second principal surface. Each of the first, second and third external electrodes includes a sputtering electrode film. Each of the outermost layers of the first, second and third external electrodes contains Cu.

In a ceramic capacitor according to a preferred embodiment of the present invention, each external electrode includes a sputtering electrode film. Therefore, the external electrodes are able to be thinned. As a result of this, the thickness of the ceramic capacitor is reduced. Thus, the ceramic capacitor according to a preferred embodiment of the present invention is suitable for being built into a substrate.

Further, in a ceramic capacitor according to a preferred embodiment of the present invention, since the external electrodes each include a sputtering electrode, the flatness of the external electrodes is able to be improved. As a result of this, the electrical connection between the external electrodes and the via hole electrodes are able to be improved in embedding the ceramic capacitor in a substrate. Accordingly, the ceramic capacitor according to a preferred embodiment of the present invention is suitable for being built into a substrate.

In a ceramic capacitor according to a preferred embodiment of the present invention, since the outermost layer of the external electrodes includes a Cu plated layer, building in a substrate is easy. Specifically, since it is preferable to dispose via hole electrodes to provide connection between an electronic component and a wiring of a substrate in building the ceramic capacitor in a substrate, it is preferable to form the via hole to face the external electrode of the electronic component in the substrate, for example, by using $CO_2$ laser or the like. Here, in a ceramic capacitor according to a preferred embodiment of the present invention, the outermost layer of the external electrode preferably includes a Cu plated layer. Therefore, laser light for irradiation to form via holes is reflected at a high reflectivity, and therefore deterioration of the ceramic capacitor is significantly reduced or prevented. Accordingly, the ceramic capacitor according to a preferred embodiment of the present invention is easily built into a substrate.

Further, in a ceramic capacitor according to a preferred embodiment of the present invention, by providing a configuration in which all of extended portions of the first and second internal electrodes are extended to the first and second side surfaces of the capacitor main body, a distance between the extended portion of the first internal electrode and the extended portion of the second internal electrode is reduced. For this reason, the path length of a current flow is reduced in the ceramic capacitor 1. Accordingly, the ceramic capacitor according to a preferred embodiment of the present invention has a low equivalent series inductance (ESL).

In a ceramic capacitor according to a preferred embodiment of the present invention, the sputtering electrode film preferably includes a NiCr film and a NiCu film disposed on the NiCr film.

In a ceramic capacitor according to a preferred embodiment of the present invention, a thickness of the sputtering electrode film is preferably about 100 nm or more and about 650 nm or less, for example.

In a ceramic capacitor according to a preferred embodiment of the present invention, each of the first, second and third external electrodes preferably further includes a Cu plated layer disposed on the sputtering electrode film.

In a ceramic capacitor according to a preferred embodiment of the present invention, a dimension along the laminating direction of the ceramic capacitor is preferably smaller than a dimension along the width direction of the ceramic capacitor.

In a ceramic capacitor according to a preferred embodiment of the present invention, it is preferred that the first external electrode is not disposed on a ridge which the first principal surface defines with the first end surface, on a ridge which the second principal surface defines with the first end surface, and on the first end surface, and the second external electrode is not disposed on a ridge which the first principal surface defines with the second end surface, on a ridge which the second principal surface defines with the second end surface, and on the second end surface.

In a ceramic capacitor according to a preferred embodiment of the present invention, a length of a portion of the third external electrode located on the first or second principal surface in the length direction is preferably larger than a length of a portion of the third external electrode located on the first or second side surface in the length direction.

In a ceramic capacitor according to a preferred embodiment of the present invention, it is preferred that a length of a portion of the first external electrode located on the first or second principal surface in the length direction is larger than a length of a portion of the first external electrode located on the first and second side surfaces in the length direction, and a length of a portion of the second external electrode located on the first or second principal surface in the length direction is larger than a length of a portion of the second external electrode located on the first and second side surfaces in the length direction.

In a ceramic capacitor according to a preferred embodiment of the present invention, the first external electrode may include a first portion extending from a portion located on the first principal surface to a portion of the first end surface, a second portion extending from a portion located on the second principal surface to a portion of the first end surface, a third portion extending from a portion located on the first side surface to a portion of the first end surface, and a fourth portion extending from a portion located on the second side surface to a portion of the first end surface. The second external electrode may include a fifth portion extending from a portion located on the first principal surface to a portion of the second end surface, a sixth portion extending from a portion located on the second principal surface to a portion of the second end surface, a seventh portion extending from a portion located on the first side surface to a portion of the second end surface, and an eighth portion extending from a portion located on the second side surface to a portion of the second end surface. In this case, it is preferred that a length in the laminating direction of each of the first and second portions, and the fifth and sixth portions is about 5% or more and about 15% or less of a dimension along the laminating direction of the ceramic capacitor, and a length in the laminating direction of each of the third and fourth portions, and the seventh and eighth portions is about 5% or more and about 15% or less of a width dimension of the ceramic capacitor, for example.

In a ceramic capacitor according to a preferred embodiment of the present invention, the first external electrode may include a first portion extending from a portion located on the first principal surface to a portion of the first end surface, a second portion extending from a portion located on the second principal surface to a portion of the first end surface, a third portion extending from a portion located on the first side surface to a portion of the first end surface, and a fourth portion extending from a portion located on the second side surface to a portion of the first end surface. The second external electrode may include a fifth portion extending from a portion located on the first principal surface to a portion of the second end surface, a sixth portion extending from a portion located on the second principal surface to a portion of the second end surface, a seventh portion extending from a portion located on the first side surface to a portion of the second end surface, and an eighth portion extending from a portion located on the second side surface to a portion of the second end surface. In this case, a length along the laminating direction of each of the first, second, fifth and sixth portions is preferably shorter than a length along the width direction of the third, fourth, seventh and eighth portions.

According to various preferred embodiments of the present invention, it is possible to provide ceramic capacitors which are low in ESL and suitable for being built into a substrate.

The above and other elements, features, steps, characteristics and advantages of the present invention will become more apparent from the following detailed description of the preferred embodiments with reference to the attached drawings.

DETAILED DESCRIPTION OF THE INVENTION

Hereinafter, examples of preferred embodiments of the present invention will be described. However, the following preferred embodiments are merely exemplifications. The present invention is not limited to the following preferred embodiments at all.

Further, in drawings referred to in the description of the preferred embodiments or the like, substantially like members in functions are denoted by like symbols. Further, the drawings referred to in the preferred embodiments or the like are schematically shown. The dimensional ratios and the like of an object pictured in a drawing may be different from that of a real object. The dimensional ratios and the like of an object may differ between drawings. The dimensional ratios and the like of specific objects have to be determined in consideration of the following description.

Figure 1:
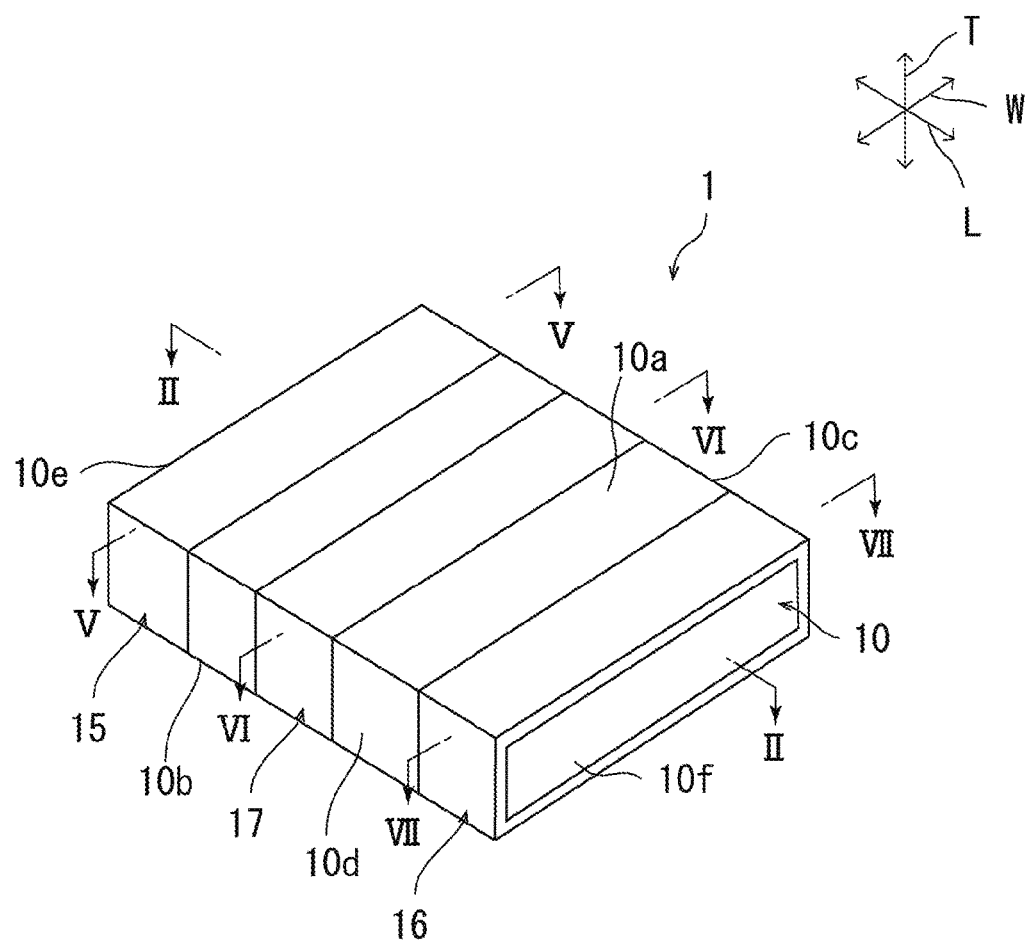
FIG. 1 is a schematic perspective view of a capacitor of a first preferred embodiment of the present invention.
Figure 2:
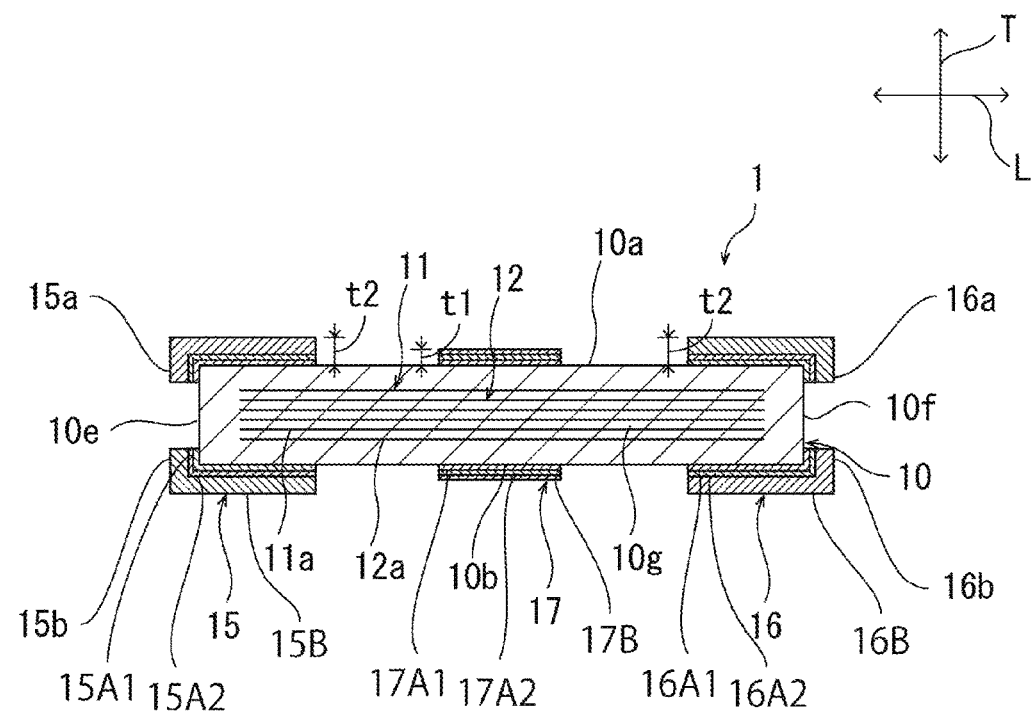
FIG. 2 is a schematic cross-sectional view taken along line II-II of FIG. 1.
Figure 3:
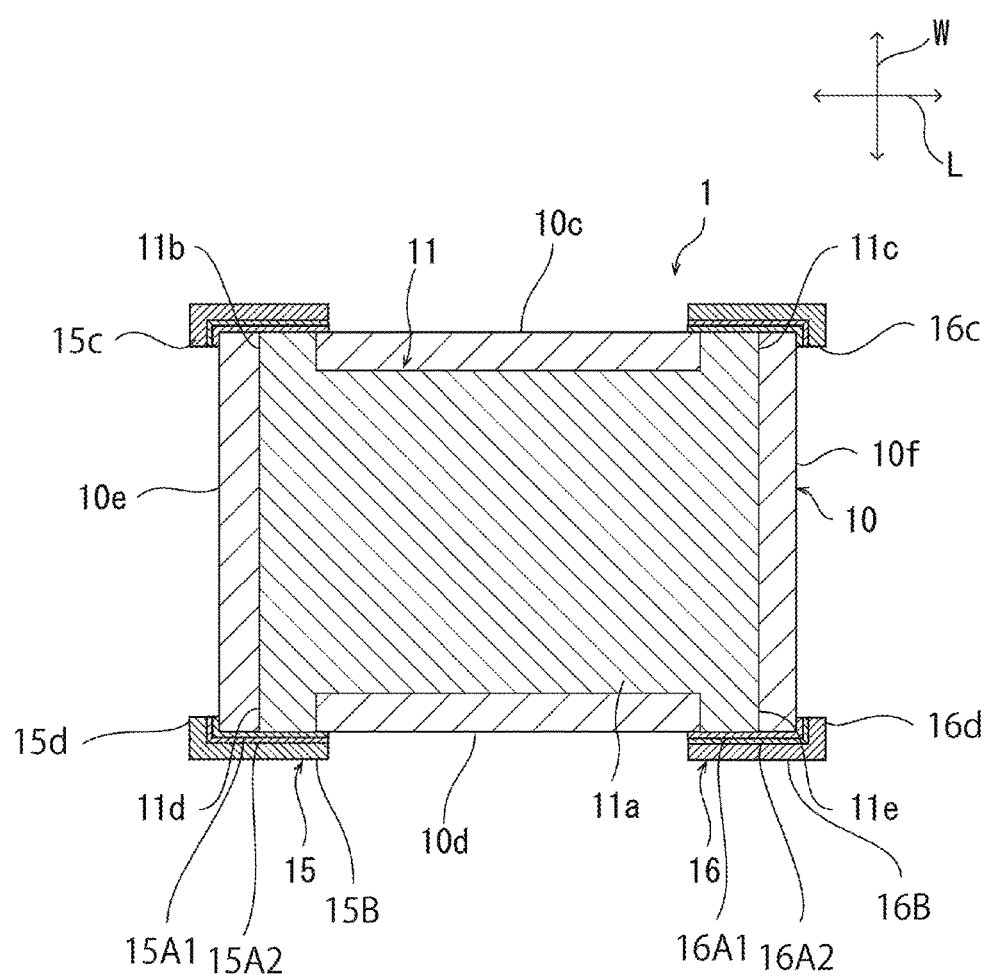
FIG. 3 is a schematic cross-sectional view of the capacitor of the first preferred embodiment of the present invention.
Figure 4:
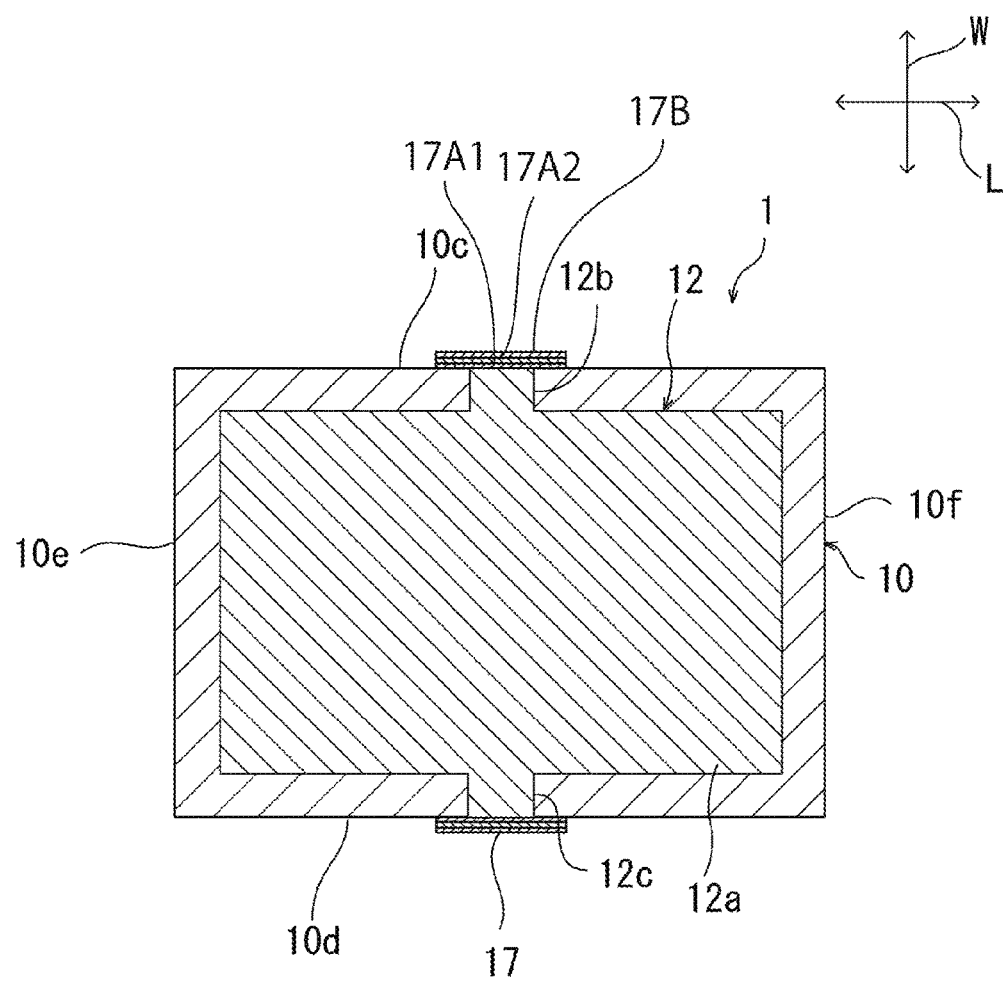
FIG. 4 is a schematic cross-sectional view of the capacitor of the first preferred embodiment of the present invention.
Figure 5:
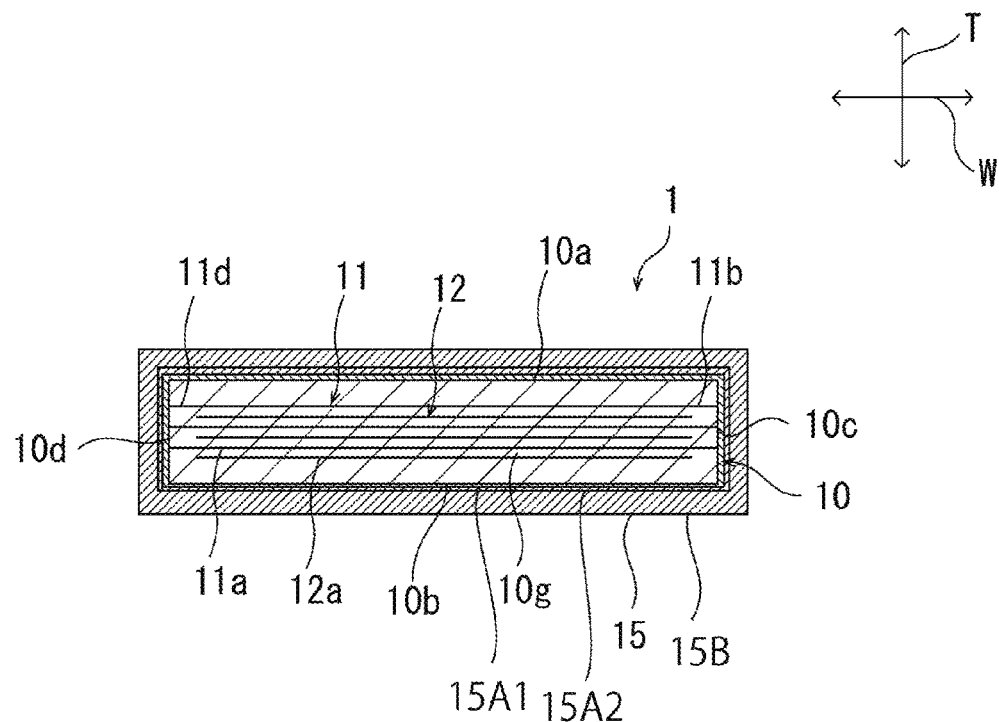
FIG. 5 is a schematic cross-sectional view taken along line V-V of FIG. 1.
Figure 6:
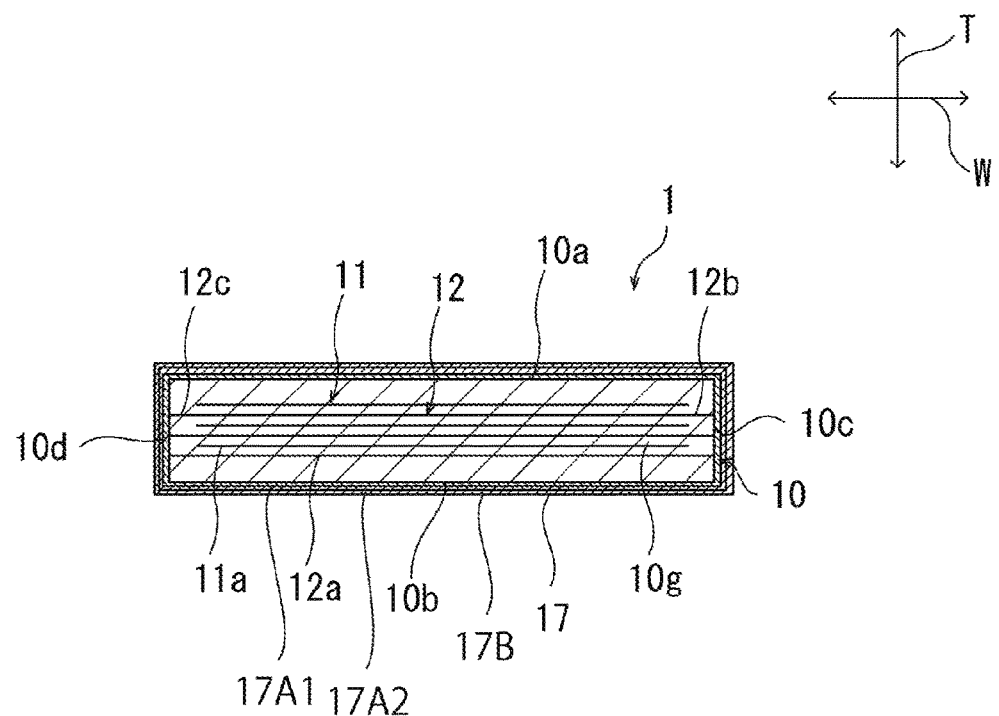
FIG. 6 is a schematic cross-sectional view taken along line VI-VI of FIG. 1.
Figure 7:
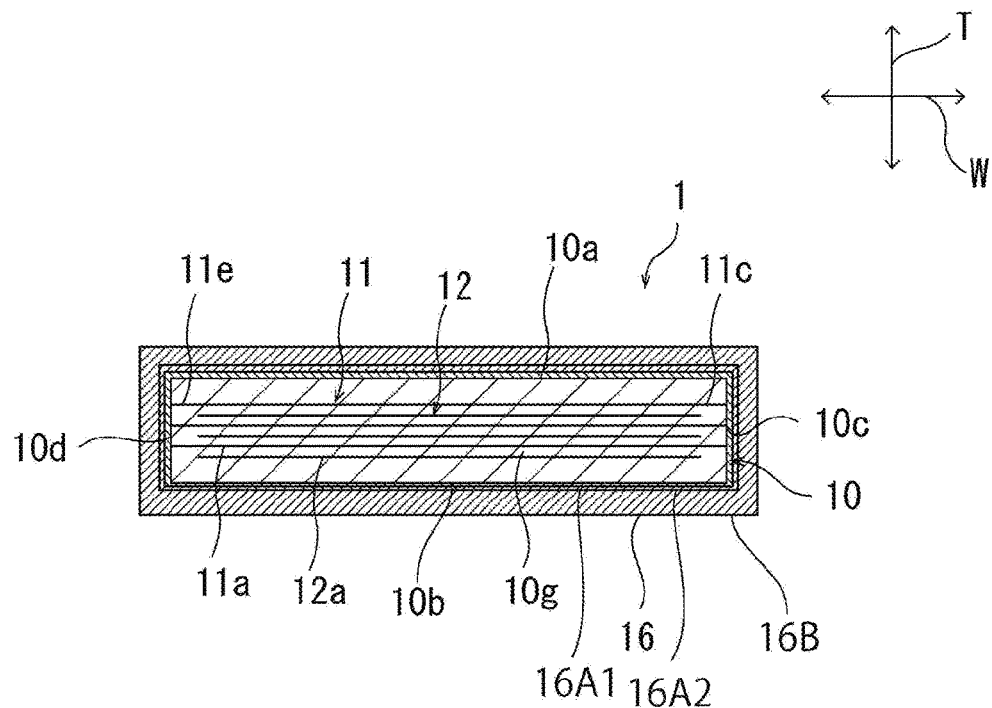
FIG. 7 is a schematic cross-sectional view taken along line VII-VII of FIG. 1.
Figure 8:
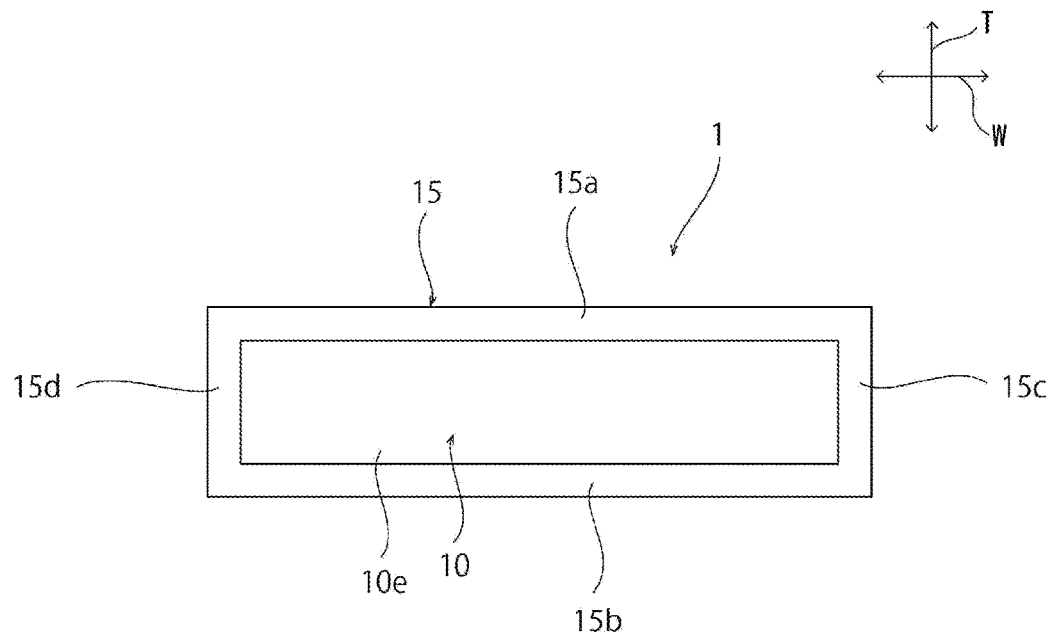
FIG. 8 is a schematic plan view of a first end surface of the capacitor of the first preferred embodiment of the present invention.
Figure 9:
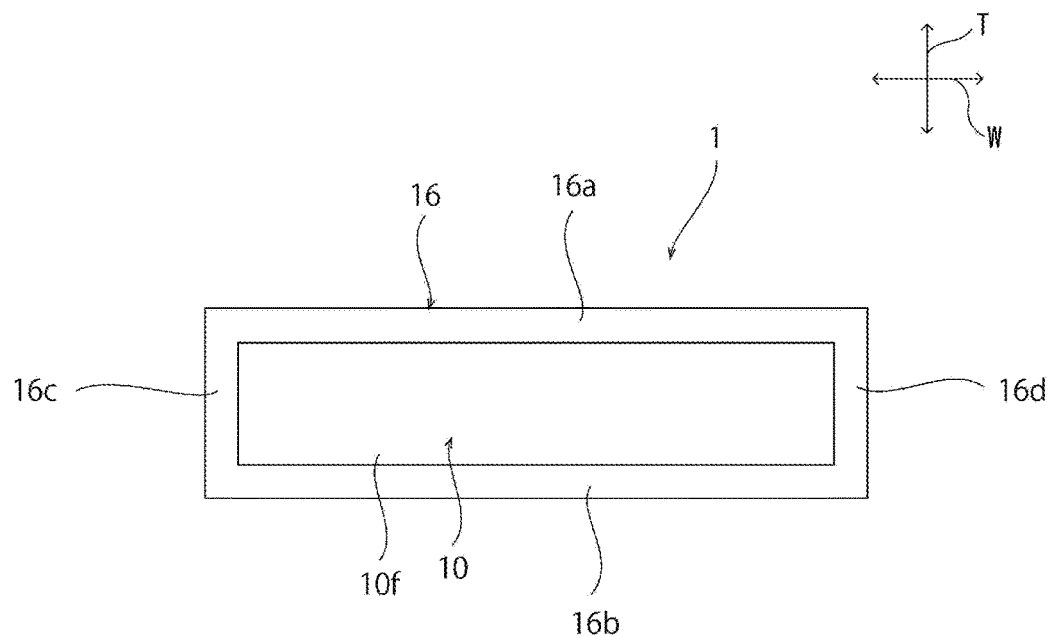
FIG. 9 is a schematic plan view of a second end surface of the capacitor of the first preferred embodiment of the present invention.

FIG. 1 is a schematic perspective view of a capacitor according to a first preferred embodiment of the present invention and FIG. 2 is a schematic cross-sectional view taken along line II-II of FIG. 1. FIG. 3 is a schematic cross-sectional view along the length direction L and the width direction W of the capacitor of the first preferred embodiment. FIG. 4 is a schematic cross-sectional view along the length direction L and the width direction W of the capacitor of the first preferred embodiment. In addition, FIGS. 3 and 4 are each a schematic cross-sectional view of sites separate in the laminating direction T. FIG. 5 is a schematic cross-sectional view taken along line V-V of FIG. 1. FIG. 6 is a schematic cross-sectional view taken along line VI-VI of FIG. 1. FIG. 7 is a schematic cross-sectional view taken along line VII-VII of FIG. 1. FIG. 8 is a schematic plan view of a first end surface of the capacitor of the present preferred embodiment. FIG. 9 is a schematic plan view of a second end surface of the capacitor of the present preferred embodiment.

As shown in FIGS. 1 to 7, the ceramic capacitor 1 includes a capacitor main body 10. The capacitor main body 10 preferably has a cuboid or substantially cuboid shape, for example. The capacitor main body 10 includes first and second principal surfaces 10a, 10b, first and second side surfaces 10c, 10d, and first and second end surfaces 10e, 10f. The first and second principal surfaces 10a, 10b each extend in the length direction L and the width direction W. The length direction L is a direction connecting the first end surface 10e and the second end surface 10f. The width direction W is perpendicular or substantially perpendicular to the length direction L. The width direction W is a direction connecting the first side surface 10c and the second side surface 10d. The first and second side surfaces 10c, 10d each extend in the length direction L and the laminating direction T. The laminating direction T is a direction connecting the first principal surface 10a and the second principal surface 10b. The laminating direction T is perpendicular or substantially perpendicular to each of the length direction L and the width direction W. The first and second end surfaces 10e, 10f each extend in the width direction W and the laminating direction T. Ridges and corners of the capacitor main body 10 may be chamfered or may be rounded; however, the capacitor main body 10 preferably includes ridges and corners rounded from the viewpoint of reducing or preventing the occurrence of cracks.

The capacitor main body 10 can be made of an appropriate dielectric ceramic. The capacitor main body 10 may be specifically configured by dielectric ceramic including, for example, $BaTiO_3$, $CaTiO_3$, $SrTiO_3$, or $CaZrO_3$. A Mn compound, a Fe compound, a Cr compound, a Co compound, a Ni compound or the like may be added to the capacitor main body 10.

Dimensions of the capacitor main body 10 are not particularly limited. However, when a height dimension, a length dimension and a width dimension of the capacitor main body 10 are denoted by DT, DL and DW, respectively, it is preferred that the relationship of DT<DW<DL, (⅐)DW≤DT≤(⅓)DW or DT<0.25 mm is satisfied, for example. Specifically, it is preferred that the relationship of 0.05 mm≤DT<0.25 mm, 0.4 mm≤DL≤1 mm, and 0.3 mm≤DW≤0.5 mm is satisfied, for example. As described above, since a dimension along the laminating direction of the ceramic capacitor 1 of the present embodiment is small, the ceramic capacitor 1 is suitable for being built into a substrate. However, when the dimension along the laminating direction of the ceramic capacitor 1 is too small, a capacitance of the ceramic capacitor 1 may be too small, or strength of the ceramic capacitor 1 may be too low. Accordingly, the dimension along the laminating direction of the ceramic capacitor 1 is preferably about ⅕ times or more, and more preferably about ½ times or more as large as the width dimension, for example.

Further, the dimensions of the ceramic capacitor 1 can be measured with use of a micrometer or a microscope.

As shown in FIG. 2, a plurality of internal electrodes 11, 12 are disposed within the capacitor main body 10. Specifically, a plurality of the first external electrodes 11 and a plurality of the second external electrodes 12 are alternately disposed along the laminating direction T in the capacitor main body 10. The first internal electrode 11 and the second internal electrode 12 adjacent to each other in the laminating direction T are opposed to each other with the ceramic portion 10g interposed therebetween. Thus, a capacitance is generated. In addition, the ceramic portion 10g is preferably about 0.5 µm or more and about 10 µm or less in thickness, for example.

As shown in FIG. 3, the first internal electrode 11 is exposed at each of the first side surface 10c and the second side surface 10d. Specifically, the first internal electrodes 11 has the opposed portion 11a, the first extended portion 11b, the second extended portion 11c, the third extended portion 11d, and the fourth extended portion 11e.

The opposed portion 11a is opposed to the second internal electrode 12 in the laminating direction T. The opposed portion 11a preferably is rectangular or substantially rectangular, for example.

The first extended portion 11b is connected to the opposed portion 11a. The first extended portion 11b is extended to the first side surface 10c. Specifically, the first extended portion 11b extends from a corner on a first side surface 10c side and a first end surface 10e side of the opposed portion 11a toward the first side surface 10c.

The second extended portion 11c is connected to the opposed portion 11a. The second extended portion 11c is extended to the first side surface 10c. Specifically, the second extended portion 11c extends from a corner on a first side surface 10c side and a second end surface 10f side of the opposed portion 11a toward the first side surface 10c. The first extended portion 11b is connected to one end in the length direction L of the opposed portion 11a, and the second extended portion 11c is connected to the other end in the length direction L of the opposed portion 11a.

The third extended portion 11d is connected to the opposed portion 11a. The third extended portion 11d is extended to the second side surface 10d. Specifically, the third extended portion 11d extends from a corner on a second side surface 10d side and a first end surface 10e side of the opposed portion 11a toward the second side surface 10d.

The fourth extended portion 11e is connected to the opposed portion 11a. The fourth extended portion 11e is extended to the second side surface 10d. Specifically, the fourth extended portion 11e extends from a corner on the second side surface 10d side and the second end surface 10f side of the opposed portion 11a toward the second side surface 10d. The third extended portion 11d is connected to one end in the length direction L of the opposed portion 11a, and the fourth extended portion 11e is connected to the other end in the length direction L of the opposed portion 11a.

As shown in FIG. 4, the second internal electrode 12 is exposed at each of the first and second side surfaces 10c, 10d. Specifically, the second internal electrode 12 includes the opposed portion 12a, the fifth extended portion 12b, and the sixth extended portion 12c.

The opposed portion 12a is opposed to the opposed portion 11a of the first internal electrode 11 in the laminating direction T. The opposed portion 12a preferably is rectangular or substantially rectangular, for example.

The fifth extended portion 12b is connected to the opposed portion 12a. The fifth extended portion 12b is extended to the first side surface 10c. The fifth extended portion 12b is located between the first extended portion 11b and the second extended portion 11c in the length direction L. The fifth extended portion 12b extends from nearly a center of the opposed portion 12a toward the first side surface 10c in the length direction L.

The sixth extended portion 12c is connected to the opposed portion 12a. The sixth extended portion 12c is extended to the second side surface 10d. The sixth extended portion 12c is located between the third extended portion 11d and the fourth extended portion 11e in the length direction L. The sixth extended portion 12c extends from nearly a center of the opposed portion 12a toward the second side surface 10d in the length direction L.

In addition, widths of the extended portions 11b, 11c, 11d, 11e, 12b, and 12c can be each, for example, about 50 µm or more and about 100 µm or less.

As described above, by including a configuration in which all of extended portions 11b, 11c, 11d, 11e, 12b, 12c of the internal electrodes 11, 12 are extended to the first and second side surfaces of the capacitor main body 10, each distance between the extended portions 11b, 11c, 11d, 11e of the first internal electrode 11 and the extended portions 12b, 12c of the second internal electrode 12 is reduced. For this reason, the path length of current flow is reduced in the ceramic capacitor. Accordingly, the equivalent series inductance (ESL) of the ceramic capacitor 1 is reduced.

The first and second internal electrodes 11, 12 can be, for example, about 0.2 µm or more and about 2 µm or less in thickness.

The first and second internal electrodes 11, 12 can be made of appropriate conductive materials. Each of the first and second internal electrodes are able to be composed of, for example, metal such as Ni, Cu, Ag, Pd or Au, or an alloy including one of these metals such as an Ag—Pd alloy.

As shown in FIG. 1, the ceramic capacitor 1 includes a plurality of external electrodes 15, 16, 17. Specifically, the ceramic capacitor 1 includes a first external electrode 15, a second external electrode 16, and a third external electrode 17.

The first external electrode 15 extends from an exposed portion of the first extended portion 11b of the first internal electrode 11 at the first side surface 10c and from an exposed portion of the third extended portion 11d of the first internal electrode 11 at the second side surface 10d so as to extend over the first and second principal surfaces 10a, 10b. Specifically, the first external electrode 15 covers exposed portions of the first extended portion 11b and the third extended portion 11d and wraps around the first side surface 10c, the first principal surface 10a, the second side surface 10d and the second principal surface 10b. A width of the first external electrode 15 is preferably about 190 μm or more and about 270 μm or less, for example.

The second external electrode 16 extends from an exposed portion of the second extended portion 11c of the first internal electrode 11 at the first side surface 10c and from an exposed portion of the fourth extended portion 11e of the first internal electrode 11 at the second side surface 10d so as to extend over the first and second principal surfaces 10a, 10b. Specifically, the second external electrode 16 covers exposed portions of the second extended portion 11c and the fourth extended portion 11e and wraps around the first side surface 10c, the first principal surface 10a, the second side surface 10d and the second principal surface 10b. A width of the second external electrode 16 is preferably about 190 μm or more and about 270 μm or less, for example.

The first external electrode 15 is disposed at one end in the length direction L of the capacitor main body 10, and the second external electrode 16 is disposed at the other end in the length direction L of the capacitor main body 10.

The third external electrode 17 is disposed between the first external electrode 15 and the second external electrode 16 in the length direction L. The third external electrode 17 extends from an exposed portion of the fifth extended portion 12b of the second internal electrode 12 at the first side surface 10c and from an exposed portion of the sixth extended portion 12c of the second internal electrode 12 at the second side surface 10d so as to extend over the first and second principal surfaces 10a, 10b. Specifically, the third external electrode 17 covers exposed portions of the fifth extended portion 12b and the sixth extended portion 12c and wraps around the first side surface 10c, the first principal surface 10a, the second side surface 10d and the second principal surface 10b. A width of the third external electrode 17 is preferably about 240 μm or more and about 320 μm or less, for example. A distance between the third external electrode 17 and the first external electrode 15 or the second external electrode 16 along the length direction L is preferably about 70 μm or more, for example.

As described above, the first to third external electrodes 15 to 17 are each disposed so as to wrap around the capacitor main body 10, and therefore areas of the external electrodes 15 to 17 are adequately secured, and via holes to face the external electrodes 15 to 17 of the ceramic capacitor 1 embedded in a substrate can be easily formed. Further, since it becomes possible to have continuity between a plurality of via hole electrodes and each of the external electrodes 15 to 17, wiring resistance between a substrate and the ceramic capacitor 1 is reduced. Accordingly, it becomes possible to further reduce the ESL.

The first to third external electrodes 15 to 17 include sputtering electrode films 15A to 17A, respectively. Specifically, in the present preferred embodiment, the sputtering electrode films 15A to 17A are in direct contact with the capacitor main body 10. Therefore, the thickness of the external electrode is smaller than an external electrode including the fired electrode. As a result of this, the thickness of the ceramic capacitor 1 is reduced. Accordingly, the ceramic capacitor 1 is suitable for being built into a substrate. Further, design flexibility of a dimension of the capacitor main body 10 is enhanced by such an extent that the thickness of the external electrodes 15 to 17 is small. Therefore, it becomes possible to secure a large effective area of the internal electrodes 11, 12. Consequently, it becomes possible to increase a capacitance of the ceramic capacitor 1 while suppressing an increase in size of a component of the ceramic capacitor 1.

The sputtering electrode films 15A to 17A preferably each contain at least one metal selected from the group consisting of, Mg, Al, Ti, W, Cr, Cu, Ni, Ag, Co, Mo and V. In addition, in the description of preferred embodiments of the present invention, the term "metal" includes "alloy". By using these metals as a metal contained in the sputtering electrode films 15A to 17A, the adhesion between the capacitor main body 10 and the sputtering electrode films 15A to 17A is improved.

In addition, each of the sputtering electrode films 15A to 17A may include a single layer or a plurality of layers. In the present preferred embodiment, each of the sputtering electrode films 15A to 17A preferably includes the plurality of layers. Specifically, the sputtering electrode films 15A to 17A include NiCr films 15A1 to 17A1 in direct contact with the capacitor main body 10 and NiCu films 15A2 to 17A2 in direct contact with the NiCr films 15A1 to 17A1, respectively.

The sputtering electrode films 15A to 17A are each preferably about 100 nm or more and about 650 nm or less in thickness. By setting the thickness of each of the sputtering electrode films 15A to 17A to this range, the flatness of the first to third external electrodes 15 to 17 is ensured, and chips of the sputtering electrode films 15A to 17A and peeling off the sputtering electrode films 15A to 17A from the capacitor main body is significantly reduced or prevented. In addition, the thicknesses of the sputtering electrode films 15A to 17A is able to be appropriately adjusted by controlling power, a processing time and a metal type at the time of sputtering.

Each of the outermost layer 15B to 17B of the first to third external electrodes 15 to 17 includes Cu. Specifically, in the present preferred embodiment, a Cu plated layer is preferably disposed on each of the sputtering electrode films 15A to 17A. The Cu plated layer may include a single layer or may be formed of a plurality of layers.

Since the outermost layer of the external electrode includes the Cu plated layer, it is possible to easily build the ceramic capacitor 1 in a substrate in embedding the ceramic capacitor 1 in a substrate. In this regard, to embed the ceramic capacitor 1 into a substrate, there is a need to provide via holes for electronic component connection in order to make the capacitor electrically continuous to the external electrodes 15 to 17, and the via holes for electronic component connection are formed with the use of a laser such as a $CO_2$ laser. When the via hole is formed using the laser, the external electrodes 15 to 17 of the ceramic capacitor 1 is directly irradiated with the laser. In this case, by configuring the outermost layers 15B to 17B of the external electrodes 15 to 17 of the Cu plated layer, a laser is able to be reflected at a high reflectivity. Accordingly, the ceramic capacitor 1 in which the outermost layers 15B to 17B of the external electrodes are composed of the Cu plated layer can be suitably used as a capacitor for being embedded in a substrate. If the external electrodes 15 to 17 have a low laser reflectance, the laser may reach the inside of the capacitor to damage the capacitor.

The plated layer is preferably about 1 µm or more and about 15 µm or less in thickness per layer, for example.

In addition, in the ceramic capacitor 1 of the present preferred embodiment, the first to third external electrodes 15 to 17 do not include a fired electrode layer.

As shown in FIG. 2, in the present preferred embodiment, a thickness t1 of a portion disposed on the first or second principal surfaces 10a, 10b of the third external electrode 17 is smaller than thicknesses t2 of portions disposed on the first or second principal surfaces 10a, 10b of the first and second external electrodes 15, 16. As a result of this, when mounting the ceramic capacitor 1 to the substrate, a mounting nozzle of a surface mount machine is prevented from abutting against only the third external electrode 17 and it also abuts against the first and second external electrodes 15, 16. For this reason, stress generated in adsorption with the mount nozzle is dispersed. Accordingly, it is possible to prevent cracks or the like from being produced in the capacitor main body 10 beginning at ends of the external electrodes 15 to 17. That is, the reliability of the ceramic capacitor 1 is improved.

It is preferred from the viewpoint of more effectively inhibiting the cracks from being produced in the capacitor main body 10 beginning at ends of the external electrodes 15 to 17 that differences between the thickness t1 of a portion disposed on the first or second principal surfaces 10a, 10b of the third external electrode 17 and the thicknesses t2 of portions disposed on the first or second principal surfaces 10a, 10b of the first and second external electrodes 15, 16, are about 0.5 µm or more, for example.

As shown in FIG. 2, FIG. 3 and FIG. 8, the first external electrode 15 extends over the first and second principal surfaces 10a, 10b/the first and second side surfaces 10c, 10d and portion of the first end surfaces 10e. The first external electrode 15 includes a first portion 15a, a second portion 15b, a third portion 15c, and a fourth portion 15d.

The first portion 15a extends from a portion located on the first principal surface 10a to a portion of the first end surface 10e. Therefore, the first portion 15a covers a ridge of the capacitor main body 10 which the first principal surface 10a defines with the first end surface 10e.

The second portion 15b extends from a portion located on the second principal surface 10b onto the first end surface 10e. Therefore, the second portion 15b covers a ridge of the capacitor main body 10 which the second principal surface 10b defines with the first end surface 10e. The second portion 15b is not directly connected to the first portion 15a. Therefore, the first end surface 10e is exposed between the first portion 15a and the second portion 15b.

The third portion 15c extends from a portion located on the first side surface 10c to a portion of the first end surface 10e. Therefore, the third portion 15c covers a ridge of the capacitor main body 10 which the first side surface 10c defines with the first end surface 10e.

The fourth portion 15d extends from a portion located on the second side surface 10d to a portion of the first end surface 10e. Therefore, the fourth portion 15d covers a ridge of the capacitor main body 10 which the second side surface 10d defines with the first end surface 10e. The fourth portion 15d is not directly connected to the third portion 15c. Therefore, the first end surface 10e is exposed between the third portion 15c and the fourth portion 15d.

As shown in FIG. 2, FIG. 3 and FIG. 9, the second external electrode 16 is disposed to extend over the first and second principal surfaces 10a, 10b/the first and second side surfaces 10c, 10d and portion of the second end surfaces 10f. The second external electrode 16 includes a fifth portion 16a, a sixth portion 16b, a seventh portion 16c, and an eighth portion 16d.

The fifth portion 16a extends from a portion located on the first principal surface 10a to a portion of the second end surface 10f. Therefore, the fifth portion 16a covers a ridge of the capacitor main body 10 which the first principal surface 10a defines with the second end surface 10f.

The sixth portion 16b extends from a portion located on the second principal surface 10b onto the second end surface 10f. Therefore, the sixth portion 16b covers a ridge of the capacitor main body 10 which the second principal surface 10b defines with the second end surface 10f. The sixth portion 16b is not directly connected to the fifth portion 16a. Therefore, the second end surface 10f is exposed between the fifth portion 16a and the sixth portion 16b.

The seventh portion 16c extends from a portion located on the first side surface 10c onto the second end surface 10f. Therefore, the seventh portion 16c covers a ridge of the capacitor main body 10 which the first side surface 10c defines with the second end surface 10f.

The eighth portion 16d extends from a portion located on the second side surface 10d onto the second end surface 10f. Therefore, the eighth portion 16d covers a ridge of the capacitor main body 10 which the second side surface 10d defines with the second end surface 10f. The eighth portion 16d is not directly connected to the seventh portion 16c. Therefore, the second end surface 10f is exposed between the seventh portion 16c and the eighth portion 16d.

As described above, the first portion to the fourth portion 15a to 15d of the first external electrode 15 cover ridges which the first end surface 10e of the capacitor main body 10 defines with first and second principal surfaces 10a, 10b, respectively, and with the first and second side surfaces 10c, 10d, respectively. The fifth portion to the eighth portion 16a to 16d of the second external electrode 16 cover ridges which the second end surface 10f of the capacitor main body 10 defines with first and second principal surfaces 10a, 10b, respectively, and with the first and second side surfaces 10c, 10d, respectively. Accordingly, the ridges of the capacitor main body 10 are protected by the first and second external electrodes 15, 16. Thus, even if shocks and stress from outside are applied to the ceramic capacitor 1, the capacitor main body 10 is hardly damaged. Accordingly, the ceramic capacitor 1 has excellent reliability.

In the ceramic capacitor 1, the first external electrode 15 does not cover the entire surface of the first end surface 10e, and the second external electrode 16 does not cover the entire surface of the second end surface 10f. In other words, as described above, the first end surface 10e is exposed between the first portion 15a and the second portion 15b, and is partially exposed between the third portion 15c and the fourth end surface 15d. Further, the second end surface 10f is exposed between the fifth portion 16a and the sixth portion 16b, and is partially exposed between the seventh portion 16c and the eighth portion 16d. Thus, the surface of the capacitor main body 10 which has a higher adhesion force to a substrate than the surfaces of the external electrodes 15, 16, can be widely exposed. Thus, the adhesion strength between the ceramic capacitor 1 and the substrate is able to be enhanced in building the ceramic capacitor 1 in the substrate. Accordingly, it is possible to significantly reduce or prevent the infiltration of the moisture or the like into a capacitor built-in substrate. Thus, even in the case of being built into the substrate, the ceramic capacitor 1 has excellent reliability.

In the ceramic capacitor 1, the length along the laminating direction of each of the first, second, fifth and sixth portions 15a, 15b, 16a, 16b is preferably shorter than the length along the width direction of the third, fourth, seventh and eighth portions 15c, 15d, 16c, 16d. According to this configuration, it is possible to control not only the first, second, fifth and sixth portions 15a, 15b, 16a, 16b but also thicknesses of the external electrodes 15, 16 in the laminating direction T, and therefore the ceramic capacitor 1 is able to be thin. Thus, it is possible to realize a ceramic capacitor 1 more suitable for mounting in a substrate.

In the ceramic capacitor 1, a length in the laminating direction T of each of the first and second portions 15a, 15b of the first external electrode 15 and the fifth and sixth portions 16a, 16b of the second external electrode 16 preferably is about 5% or more and about 15% or less of a dimension along the laminating direction T of the ceramic capacitor 1, for example. A length in the laminating direction T of each of the third and fourth portions 15c, 15d of the first external electrode 15 and the seventh and eighth portions 16c, 16d of the second external electrode 16 preferably is about 5% or more and about 15% or less of a width dimension of the ceramic capacitor 1, for example. As a result of this, the surface of the capacitor main body 10 which has a higher adhesion force to a substrate than the surfaces of the external electrodes 15, 16, is able to be exposed in an optimum range. Thus, the adhesion to the substrate is able to be improved in building the ceramic capacitor 1 in a substrate. Further, since the ridges of the capacitor main body 10 is able to be protected by the external electrodes 15, 16, the ceramic capacitor 1 is less likely to be broken or cracked. And, when the length each of the third and fourth portions 15c, 15d of the first external electrode 15 and the seventh and eighth portions 16c, 16d of the second external electrode 16 is set to an optimum range, dimensions of external electrodes in the length direction of the ceramic capacitor 1 are also able to be controlled. Thus, the ceramic capacitor 1 hardly causes insertion defect in mounting the ceramic capacitor 1 in a cavity of the substrate, and mounting error of the ceramic capacitor 1 hardly occurs.

Further, in the ceramic capacitor 1, a length in the laminating direction T of each of the first and second portions 15a, 15b of the first external electrode 15 and the fifth and sixth portions 16a, 16b of the second external electrode 16 preferably is more preferably about 8% or more and about 12% or less of a dimension along the laminating direction T of the ceramic capacitor 1, for example. The above-mentioned effect is more remarkable by setting the above-mentioned dimensions to this range.

Figure 12A:
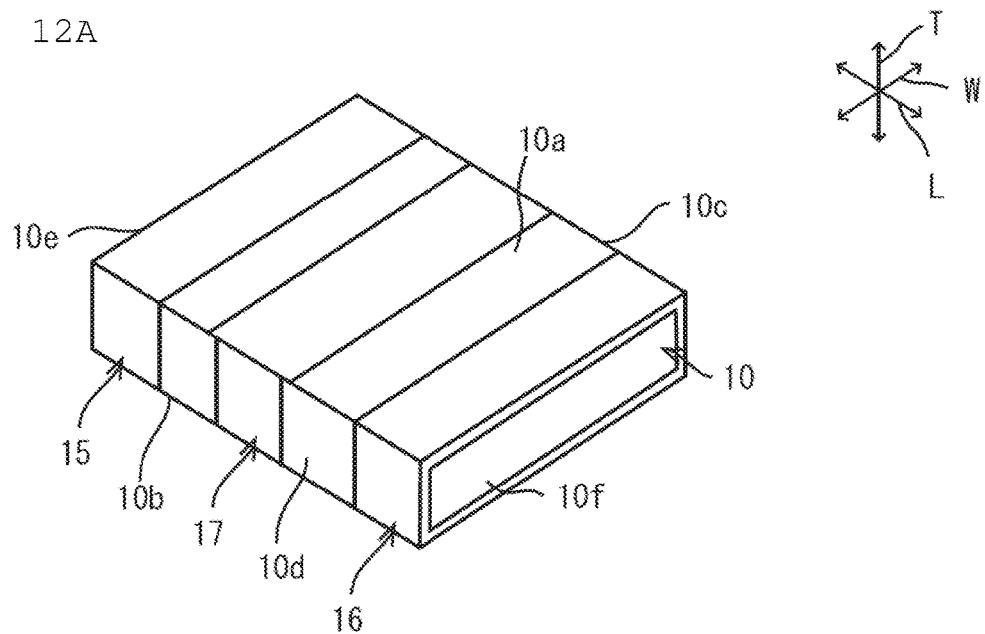
FIG. 12A is a schematic perspective view of a capacitor of a preferred embodiment of the present invention.

It is preferred that a relationship of L1>L2 holds when lengths in the length direction L of portions located on the first and second principal surfaces 10a, 10b of the third external electrode 17 are each denoted by L1, and lengths in the length direction L of portions located on the first and second side surfaces 10c, 10d of the third external electrode 17 are each denoted by L2, as shown in FIG. 12A. According to this configuration, areas of portions located on the first and second principal surfaces 10a, 10b of the third external electrode 17 is able to be large. As a result of this, an area capable of being irradiated with laser light in order to form, in the ceramic capacitor 1—built in substrate, a via hole to face the third external electrode 17 of the ceramic capacitor 1, is able to be large. Accordingly, defective connection between the via hole electrode and the ceramic capacitor 1 is significantly reduced or prevented. Further, flexibility of a position of the via hole electrode is improved.

Further, width dimensions of portions located on the first and second side surfaces 10c, 10d of the third external electrode 17 are preferably smaller than width dimensions of portions located on the first and second principal surfaces 10a, 10b of the third external electrode 17. According to this configuration, an area of an exposed portion of the capacitor main body 10 which is high in adhesion to a substrate is able to be large. As a result of this, adhesion between the ceramic capacitor 1 and the substrate is able to be improved. Therefore, it is possible to inhibit the ceramic capacitor 1 from peeling off from a substrate resulting in moisture infiltrating from a peeled portion. As a result of this, it is possible to significantly reduce or prevent the occurrence of migration.

Figure 12B:
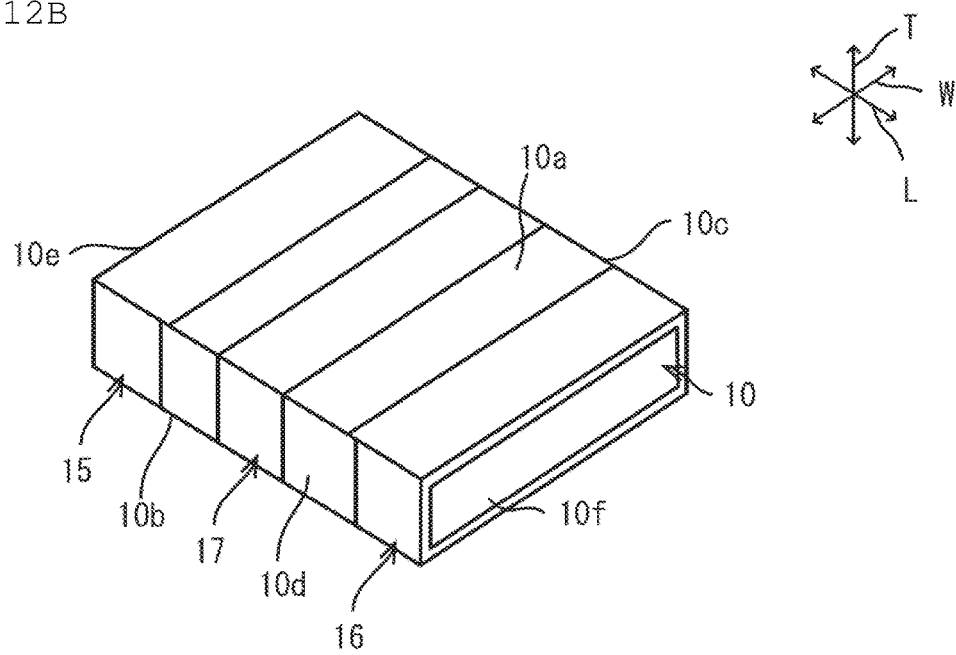
FIG. 12B is a schematic perspective view of a capacitor of a preferred embodiment of the present invention.

In the ceramic capacitor 1, it is preferred that a relationship of L3>L4 holds when lengths in the length direction L of portions located on the first and second principal surfaces 10a, 10b of the first and second external electrodes 15, 16 are each denoted by L3, and lengths in the length direction L of portions located on the first and second side surfaces 10c, 10d of the first and second external electrodes 15, 16 are each denoted by L4, as shown in FIG. 12B. According to this configuration, surface areas of portions located on the first and second principal surfaces 10a, 10b of the first and second external electrodes 15, 16 is able to be large. As a result of this, an area capable of being irradiated with laser light in order to form, in the ceramic capacitor 1—built in substrate, a via hole to face the first and second external electrodes 15, 16 of the ceramic capacitor 1, is able to be large. Accordingly, defective connection between the via hole electrode and the ceramic capacitor 1 is significantly reduced or prevented. Further, flexibility of a position of the via hole electrode is able to be improved. Further, since widths of portions located on the first and second side surfaces 10c, 10d of the first and second external electrodes 15, 16 are smaller than widths of portions located on the first and second principal surfaces 10a, 10b of the first and second external electrodes 15, 16, an area of an exposed portion of the capacitor main body 10 which is high in adhesion to a substrate is able to be large. As a result of this, adhesion between the ceramic capacitor 1 and the substrate is able to be improved. Therefore, it is possible to inhibit the ceramic capacitor 1 from peeling off from a substrate resulting in moisture infiltrating from a peeled portion. As a result of this, it is possible to suppress the occurrence of short-circuit between the first external electrode 15 and the second external electrode 16 resulting from migration.

Further, width dimensions of portions located on the side surfaces 10c, 10d of the external electrodes 15, 16 are preferably smaller than width dimensions of portions located on the principal surfaces 10a, 10b of the external electrodes 15, 16. According to this configuration, an area of an exposed portion of the capacitor main body 10 which is high in adhesion to a substrate is able to be large. Therefore, the adhesion between the ceramic capacitor 1 and the substrate is able to be improved. Therefore, it is possible to inhibit the ceramic capacitor 1 from peeling off from a substrate resulting in moisture infiltrating from a peeled portion. As a result of this, it is possible to suppress the occurrence of short-circuit between the first external electrode 15 and the second external electrode 16 resulting from migration.

L2/L1 is preferably about 0.96 or less, for example, from the viewpoint of more effectively preventing the defective connection between the via hole electrode and the ceramic capacitor 1 and from the viewpoint of more improving the adhesion between the substrate and the ceramic capacitor 1 to more effectively suppress the occurrence of migration.

L2/L1 is preferably about 0.77 or more, for example, from the viewpoint of avoiding the exposure of the internal electrodes and from the viewpoint of ensuring an adequate distance between the first and second external electrodes 15, 16 and the third external electrode 17.

L4/L3 is preferably about 0.96 or less, for example, from the viewpoint of more effectively preventing the defective connection between the via hole electrode and the ceramic capacitor 1 and from the viewpoint of more improving the adhesion between the substrate and the ceramic capacitor 1 to more effectively suppress the occurrence of migration.

L4/L3 is preferably about 0.78 or more, for example, from the viewpoint of avoiding the exposure of the internal electrodes and from the viewpoint of ensuring an adequate distance between the first and second external electrodes 15, 16 and the third external electrode 17.

Next, an example of a method for manufacturing the ceramic capacitor 1 will be described.

First, ceramic green sheets, a conductive paste for internal electrodes and a conductive paste for external terminal electrodes are each prepared. The ceramic green sheet and the conductive pastes may contain a binder and a solvent. For the binder and the solvent to be used for the ceramic green sheet and the conductive paste, publicly known ones can be used.

Next, onto the ceramic green sheets, the conductive paste is applied in predetermined patterns, for example, by a screen printing method or a gravure printing method, thus forming internal electrode patterns.

Then, the ceramic green sheets without any applied internal electrode pattern for external layers are laminated to reach a predetermined number of sheets, on the surface thereof, the ceramic green sheets with the applied internal electrode patterns are laminated in turn, and on the surface thereof, the ceramic green sheets for external layers are laminated to reach a predetermined number of sheets to prepare a mother laminated body. Thereafter, the mother laminated body is pressed in the laminating direction by a method such as isostatic press.

Then, a raw ceramic laminated body is cut out by cutting the mother laminated body into a predetermined size. In this regard, the raw ceramic laminated body may include ridges and corners rounded by barrel polishing or the like.

Next, the raw ceramic laminated body is fired to obtain a capacitor main body 10. The firing temperature is preferably, for example, about 900° C. or higher and about 1300° C. or lower, depending on the ceramic materials and conductive materials to be used. Thereafter, the capacitor main body 10 may include ridges and corners rounded by barrel polishing of the capacitor main body 10 or the like.

Next, a sputtering electrode film is formed. First, the fired capacitor main body 10 is inserted into a dedicated mask jig. The masking jig is configured in such a way that only regions of the capacitor main body 10 on which thin film electrode layers are desired to be formed are exposed when the fired capacitor main body 10 is inserted into the mask jig. The capacitor main body 10 is supplied to a sputtering apparatus with only a region, on which external electrodes are desired to be formed, of a principal surface of the capacitor main body 10 exposed, and thin film electrode layers are formed on the predetermined regions of a principal surface of the capacitor main body 10 by a sputtering method. For example, sputtering electrode films 15A to 17A composed of a laminated body of two layers of NiCr films 15A1 to 17A1 and NiCu films 15A2 to 17A2 are formed. The thicknesses of the sputtering electrode films 15A to 17A can be adjusted by controlling power, a processing time and a metal type. Examples of metal kinds to be used for the sputtering method include Ni, Cu, Ti, Cr, Ag and the like. Further, an alloy such as NiCr or NiCu may be used as the metal kinds to be used for the sputtering method.

Thereafter, Cu plated layers are formed on the sputtering electrode films 15A to 17A by a method such as electrolytic plating to complete the external electrodes 15 to 17.

The ceramic capacitor 1 can be manufactured by the above-mentioned process steps, for example.

Hereinafter, another example of a preferred embodiment of the present invention will be described. In the following description, a member having a function substantially common to that of the first preferred embodiment is denoted by the same symbol, and descriptions of the member will be omitted.

Second Preferred Embodiment

Figure 10:
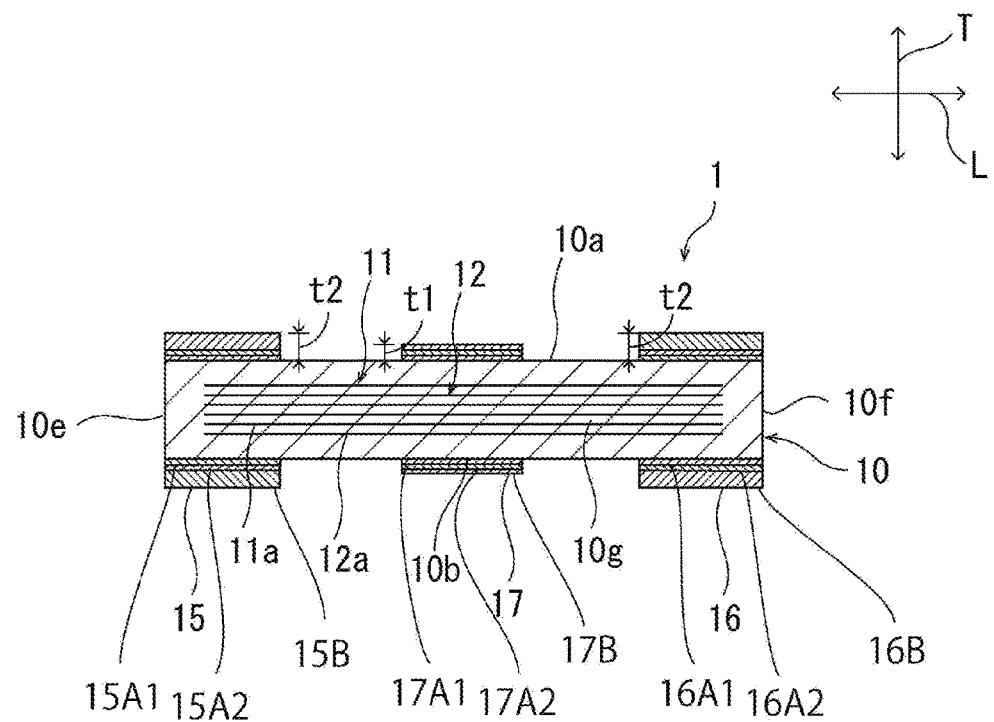
FIG. 10 is a schematic cross-sectional view of a capacitor of a second preferred embodiment of the present invention.
Figure 11:
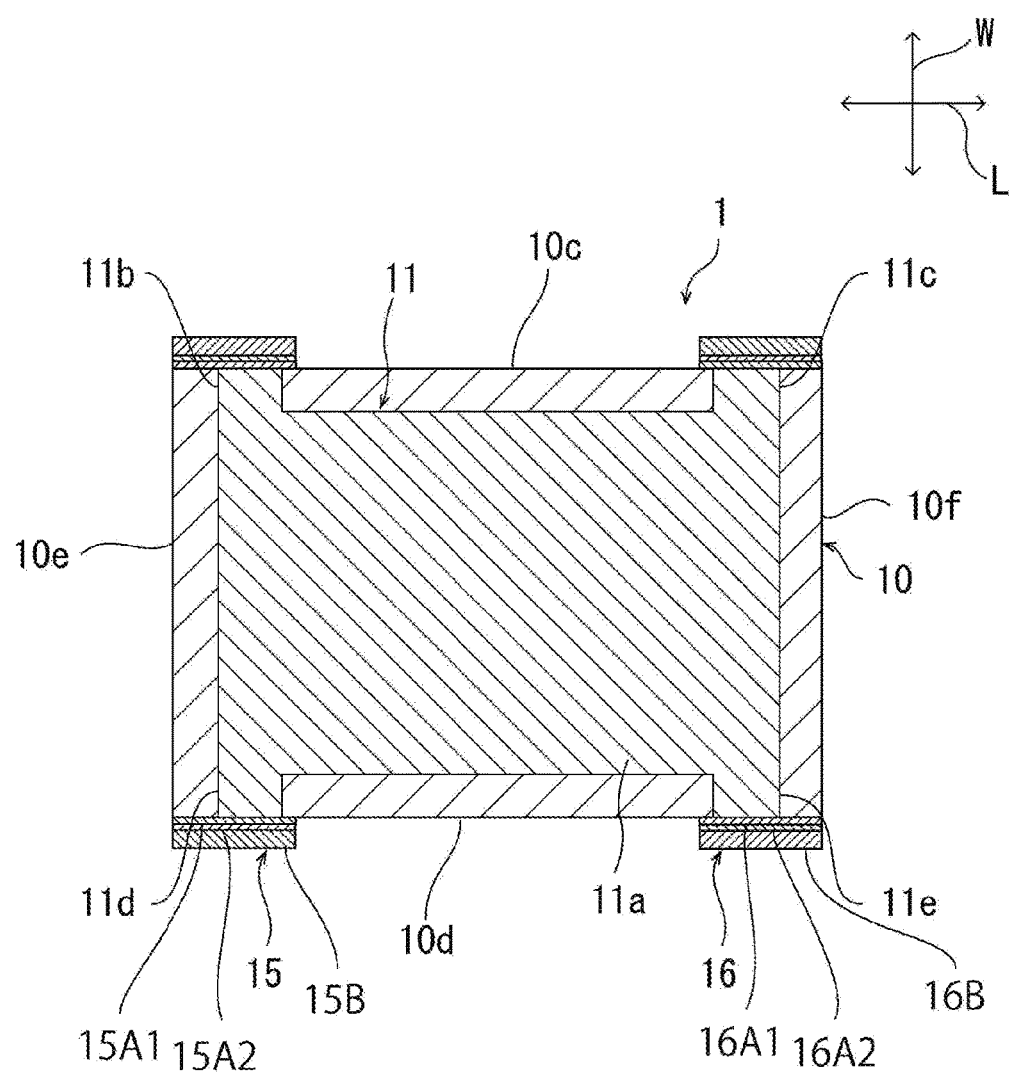
FIG. 11 is a schematic cross-sectional view of a capacitor of the second preferred embodiment of the present invention.

FIG. 10 and FIG. 11 are each a schematic cross-sectional view of a capacitor according to a second preferred embodiment of the present invention. In the first preferred embodiment, an example has been described in which the first external electrode 15 includes the first portion 15a, the second portion 15b, the third portion 15c and the fourth portion 15d, and the second external electrode 16 includes the fifth portion 16a, the sixth portion 16b, the seventh portion 16c and the eighth portion 16d. However, the present invention is not limited to this configuration.

As with the ceramic capacitor 1a shown in FIG. 10 and FIG. 11, the first to third external electrodes 15 to 17 do not have to have the first portion to the eighth portion 15a to 15d, 16a to 16d. Specifically, in the ceramic capacitor 1a, the first external electrode 15 is not disposed on a ridge which the first principal surface 10a defines with the first end surface 10e, on a ridge which the second principal surface 10b defines with the first end surface 10e, and on the first end surface 10e. Further, the second external electrode 16 is not disposed on a ridge which the first principal surface 10a defines with the second end surface 10f, on a ridge which the second principal surface 10b defines with the second end surface 10f, and on the second end surface 10f.

Preferred embodiments of the present invention will be described in more detail below based on specific examples, but the present invention is not limited to the following Examples, and variations and modifications may be appropriately made without departing from the gist of the present invention.

EXAMPLE 1

1000 pieces of capacitors having the substantially same constitution as in the ceramic capacitor 1 of the first preferred embodiment were prepared under the following conditions using the manufacturing method described in the first preferred embodiment.

Conditions:
Dimension of a ceramic capacitor (standard dimension): L×W×T=1.000 mm×0.600 mm×0.220 mm
Thickness of a capacitor main body: 200 μm
Ceramic material: $BaTi_2O_3$
Capacitance: 1 μF
Rated voltage: 6.3V
Sputtering electrode film: NiCr film, NiCu film (two layer structure)
Thickness of a NiCr film: 150 nm
Thickness of a NiCu film: 150 nm
Plated layer: one Cu plated layer
Thickness of a plated layer: 10 μm

COMPARATIVE EXAMPLE 1

1000 samples were prepared in the same manner as in Example 1 except that each of the external electrodes was composed of a laminated body of a base electrode and a Cu plated layer and the following conditions were used.

Thickness of a capacitor main body: 84 μm
Material of a base electrode layer: Ni
Thickness of a base electrode layer: 10 μm
Evaluation of Flatness of External Electrode Each of the ceramic capacitors prepared in Example 1 and Comparative Example 1 was embedded in a substrate to prepare a ceramic capacitor built-in substrate. Next, a side surface of the ceramic capacitor built-in substrate was polished until a center in a planar view of the via hole electrode was exposed.

Next, the exposed cross section was observed using a metallurgical microscope (MM-60 manufactured by NIKON CORPORATION), and the presence or absence of the defective connection between the external electrode and the via hole electrode was checked. Specifically, a sample in which the external electrode does not contact the via hole electrode, or a sample in which a resin residue is recognized between the external electrode and the via hole electrode was rated as a defective product, and the number of the defective products was counted. The results are shown in Table 1.

TABLE 1

|  | Defective Connection Product/Number of Samples |
|---|---|
| Example 1 | 0/30 |
| Comparative Example 1 | 8/30 |

It is determined from the results shown in Table 1 that the defective connection between the ceramic capacitor and the ceramic capacitor is significantly reduced or prevented.
Experimental Example A plurality of capacitors in which their constitutions were substantially the same as that of the ceramic capacitor 1 of the first preferred embodiment and the thicknesses of the sputtering electrode films are thicknesses shown in Table 2, were prepared as samples using the manufacturing method described in the first preferred embodiment, and flatness of the external electrode, adhesion between the sputtering electrode film and the capacitor main body, and chip of the external electrode were evaluated. In addition, sputtering conditions were as follows.
Sputtering Conditions Sputtering electrode film: laminated body of a NiCr film and a NiCu film
Apparatus: batch type sputtering apparatus
Ar gas flow rate: 0.8 cc/min
Pressure in film forming chamber: 0.33 Pa Measurement Method of Thickness of Sputtering Electrode Film A side surface of each of the ceramic capacitors prepared in Experiment Examples was polished until a width dimension of the ceramic capacitor was reduced to a half to expose a cross section of the ceramic capacitor.

Next, the exposed cross section was observed using a scanning electron microscope to measure a thickness of the sputtering electrode film. The results are shown in Table 2.
Evaluation of Flatness of External Electrode Each of the ceramic capacitors prepared in Experiment Examples was embedded in a substrate to prepare a ceramic capacitor built-in substrate. Next, a side surface of the ceramic capacitor built-in substrate was polished until a center in a planar view of the via hole electrode was exposed.

Next, the exposed cross section was observed using a metallurgical microscope (MM-60 manufactured by NIKON CORPORATION), and the presence or absence of the defective connection between the external electrode and the via hole electrode was checked. Specifically, a sample in which the external electrode does not contact the via hole electrode, or a sample in which a resin residue is recognized between the external electrode and the via hole electrode was rated as a flatness defective product and the number of the defective products was counted. The results are shown in Table 2.
Adhesion Evaluation of Sputtering Electrode Film An adhesive tape (adhesion force is about 8 N per width of 25 mm, nominal width: 12 to 19 mm) according to JIS Z 1522 as a tape for test was bonded to each of the sputtering electrode films formed in Experimental Examples, and the tape was pressed for about 10 seconds while taking care not to cause generation of air bubbles between the tape and the sputtering electrode film.

Thereafter, a portion of the tape not bonded to the sputtering electrode film was held with a hand and pulled in a direction perpendicular or substantially perpendicular to the sputtering electrode film to be peeled off. A sample in which the sputtering electrode film adhered to the tape was rated as a defective product, and the number of the defective products was counted. The results are shown in Table 2.
Evaluation of Chip of External Electrode Each of the ceramic capacitors prepared in Experimental Examples was observed using a stereo microscope, and a sample in which a hole of 5 nm or more in diameter was formed in the external electrode and the surface of the capacitor main body was exposed, was rated as a chip defective product and the number of the defective products was counted. The results are shown in Table 2.

TABLE 2

| Processing Time (min) | Thickness of NiCr film (nm) | Thickness of NiCu film (nm) | Thickness of Sputtering Electrode Film (nm) | Number of Flatness Defective Products/Number of Samples (nm) | Number of Peeling Defective Products/Number of Samples | Number of Chip Defective Products/Number of Samples | Thickness of Sputtering Electrode Film/Thickness of Capacitor Main Body |
|---|---|---|---|---|---|---|---|
| 8 | 25 | 25 | 50 | 0/30 | 0/1000 | 3/1000 | 0.069 |
| 15 | 50 | 50 | 100 | 0/30 | 0/1000 | 0/1000 | 0.139 |
| 25 | 75 | 75 | 150 | 0/30 | 0/1000 | 0/1000 | 0.208 |
| 30 | 100 | 100 | 200 | 0/30 | 0/1000 | 0/1000 | 0.278 |
| 45 | 150 | 150 | 300 | 0/30 | 0/1000 | 0/1000 | 0.417 |
| 60 | 200 | 200 | 400 | 0/30 | 0/1000 | 0/1000 | 0.556 |

TABLE 2-continued

| Processing Time (min) | Thickness of NiCr film (nm) | Thickness of NiCu film (nm) | Thickness of Sputtering Electrode Film (nm) | Number of Flatness Defective Products/Number of Samples (nm) | Number of Peeling Defective Products/Number of Samples | Number of Chip Defective Products/Number of Samples | Thickness of Sputtering Electrode Film/Thickness of Capacitor Main Body |
|---|---|---|---|---|---|---|---|
| 75 | 250 | 250 | 500 | 0/30 | 0/1000 | 0/1000 | 0.694 |
| 90 | 300 | 300 | 600 | 0/30 | 0/1000 | 0/1000 | 0.833 |
| 100 | 325 | 325 | 650 | 0/30 | 0/1000 | 0/1000 | 0.903 |
| 105 | 350 | 350 | 700 | 0/30 | 5/1000 | 0/1000 | 0.972 |

It is determined from the results shown in FIG. 2 that by setting the thickness of the sputtering electrode to 100 nm or more and 650 nm or less, the flatness of the external electrode is able to be improved and the chip of the external electrode is significantly reduced or prevented. Further, it is determined that the sputtering electrode film is prevented from peeling off from the capacitor main body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic capacitor comprising:
a capacitor main body including first and second principal surfaces extending in a length direction and a width direction perpendicular or substantially perpendicular to the length direction, first and second side surfaces extending in the length direction and a laminating direction perpendicular or substantially perpendicular to each of the length direction and the width direction, and first and second end surfaces extending in the width direction and the laminating direction;
a plurality of internal electrodes disposed in the capacitor main body, and exposed at each of the first and second side surfaces; and
a plurality of external electrodes extending from exposed portions of the internal electrodes at the first side surface and exposed portions of the internal electrodes at the second side surface to the first and second principal surfaces; wherein
each of the plurality of internal electrodes includes:
a first internal electrode; and
a second internal electrode opposed to the first internal electrode in the laminating direction;
the first internal electrode includes:
a first opposed portion opposed to the second internal electrode;
first and second extended portions connected to the first opposed portion, and each extended to the first side surface; and
third and fourth extended portions connected to the first opposed portion, and each extended to the second side surface;
the second internal electrode includes:
a second opposed portion opposed to the first opposed portion;
a fifth extended portion connected to the second opposed portion, and extended to the first side surface; and
a sixth extended portion connected to the second opposed portion, and extended to the second side surface;
each of the plurality of external electrodes includes:
a first external electrode covering an exposed portion of the first extended portion at the first side surface and an exposed portion of the third extended portion at the second side surface, and wrapping around the first side surface, the first principal surface, the second side surface, and the second principal surface;
a second external electrode covering an exposed portion of the second extended portion at the first side surface and an exposed portion of the fourth extended portion at the second side surface, and wrapping around the first side surface, the first principal surface, the second side surface, and the second principal surface; and
a third external electrode covering an exposed portion of the fifth extended portion at the first side surface and an exposed portion of the sixth extended portion at the second side surface, and wrapping around the first side surface, the first principal surface, the second side surface, and the second principal surface; wherein
each of the first, second and third external electrodes includes a sputtered electrode film that is in direct contact with the capacitor main body;
each of outermost layers of the first, second and third external electrodes contains Cu; and
a length of a portion of the third external electrode located on the first or second principal surface in the length direction is larger than a length of a portion of the third external electrode located on the first or second side surface in the length direction.

2. The ceramic capacitor according to claim 1, wherein the sputtered electrode film includes a NiCr film and a NiCu film disposed on the NiCr film.

3. The ceramic capacitor according to claim 1, wherein a thickness of the sputtered electrode film is about 100 nm or more and about 650 nm or less.

4. The ceramic capacitor according to claim 1, wherein each of the first, second and third external electrodes includes a Cu plated layer disposed on the sputtered electrode film.

5. The ceramic capacitor according to claim 1, wherein a dimension along the laminating direction of the ceramic capacitor is smaller than a dimension along the width direction of the ceramic capacitor.

6. The ceramic capacitor according to claim 1, wherein the first external electrode is not disposed on a ridge which the first principal surface defines with the first end surface, on a ridge which the second principal surface defines with the first end surface, and on the first end surface; and
the second external electrode is not disposed on a ridge which the first principal surface defines with the second end surface, on a ridge which the second principal surface defines with the second end surface, and on the second end surface.

7. The ceramic capacitor according to claim 1, wherein
a length of a portion of the first external electrode located on the first or second principal surface in the length direction is larger than a length of a portion of the first external electrode located on the first and second side surfaces in the length direction; and
a length of a portion of the second external electrode located on the first or second principal surface in the length direction is larger than a length of a portion of the second external electrode located on the first and second side surfaces in the length direction.

8. The ceramic capacitor according to claim 1, wherein the capacitor main body has a cuboid or substantially cuboid shape.

9. The ceramic capacitor according to claim 1, wherein
a width dimension of the ceramic capacitor is denoted as DW;
a height dimension is of the ceramic capacitor denoted as DT;
a length dimension is of the ceramic capacitor denoted as DL;
DW, DT and DL satisfy following relationships:

$DT<DW<DL$; and (about $\frac{1}{7}$)$DW \leq DT \leq$(about $\frac{1}{3}$)$DW$.

10. The ceramic capacitor according to claim 1, wherein
a width dimension of the ceramic capacitor is denoted as DW;
a height dimension of the ceramic capacitor is denoted as DT;
a length dimension of the ceramic capacitor is denoted as DL;
DW, DT and DL satisfy following relationships:

0.05 mm$\leq DT<$about 0.25 mm;

about 0.4 mm$\leq DL \leq$about 1 mm; and about 0.3 mm$\leq DW \leq$about 0.5 mm.

11. The ceramic capacitor according to claim 1, wherein a dimension of the ceramic capacitor in the laminating direction is about $\frac{1}{5}$ times or more and about $\frac{1}{2}$ times or less as large as the width dimension.

12. The ceramic capacitor according to claim 1, wherein a ceramic portion between adjacent ones of the plurality of internal electrodes is about 0.5 μm or more and about 10 μm or less in thickness.

13. The ceramic capacitor according to claim 1, wherein each of the plurality of internal electrodes has a thickness of about 0.2 μm or more and about 2 μm or less.

14. The ceramic capacitor according to claim 1, wherein each of the first and second external electrodes has a width of about 190 μm or more and about 270 μm or less.

15. The ceramic capacitor according to claim 1, wherein the capacitor main body includes a plurality of via holes that are electrically continuous with the plurality of external electrodes.

16. A ceramic capacitor comprising:
a capacitor main body including first and second principal surfaces extending in a length direction and a width direction perpendicular or substantially perpendicular to the length direction, first and second side surfaces extending in the length direction and a laminating direction perpendicular or substantially perpendicular to each of the length direction and the width direction, and first and second end surfaces extending in the width direction and the laminating direction;
a plurality of internal electrodes disposed in the capacitor main body, and exposed at each of the first and second side surfaces; and
a plurality of external electrodes extending from exposed portions of the internal electrodes at the first side surface and exposed portions of the internal electrodes at the second side surface to the first and second principal surfaces; wherein
each of the plurality of internal electrodes includes:
a first internal electrode; and
a second internal electrode opposed to the first internal electrode in the laminating direction;
the first internal electrode includes:
a first opposed portion opposed to the second internal electrode;
first and second extended portions connected to the first opposed portion, and each extended to the first side surface; and
third and fourth extended portions connected to the first opposed portion, and each extended to the second side surface;
the second internal electrode includes:
a second opposed portion opposed to the first opposed portion;
a fifth extended portion connected to the second opposed portion, and extended to the first side surface; and
a sixth extended portion connected to the second opposed portion, and extended to the second side surface;
each of the plurality of external electrodes includes:
a first external electrode covering an exposed portion of the first extended portion at the first side surface and an exposed portion of the third extended portion at the second side surface, and wrapping around the first side surface, the first principal surface, the second side surface, and the second principal surface;
a second external electrode covering an exposed portion of the second extended portion at the first side surface and an exposed portion of the fourth extended portion at the second side surface, and wrapping around the first side surface, the first principal surface, the second side surface, and the second principal surface; and
a third external electrode covering an exposed portion of the fifth extended portion at the first side surface and an exposed portion of the sixth extended portion at the second side surface, and wrapping around the first side surface, the first principal surface, the second side surface, and the second principal surface; wherein
each of the first, second and third external electrodes includes a sputtered electrode film that is in direct contact with the capacitor main body;
each of outermost layers of the first, second and third external electrodes contains Cu;
the first external electrode includes:
a first portion extending from a portion located on the first principal surface to a portion of the first end surface;
a second portion extending from a portion located on the second principal surface to a portion of the first end surface;

a third portion extending from a portion located on the first side surface to a portion of the first end surface; and
a fourth portion extending from a portion located on the second side surface to a portion of the first end surface, and the second external electrode includes:
a fifth portion extending from a portion located on the first principal surface to a portion of the second end surface;
a sixth portion extending from a portion located on the second principal surface to a portion of the second end surface;
a seventh portion extending from a portion located on the first side surface to a portion of the second end surface; and
an eighth portion extending from a portion located on the second side surface to a portion of the second end surface, and
lengths of the first and second portions, and lengths of the fifth and sixth portions in the laminating direction are each about 5% or more and about 15% or less of a dimension of the ceramic capacitor in the laminating direction; and
lengths of the third and fourth portions, and lengths of the seventh and eighth portions in the laminating direction are each about 5% or more and about 15% or less of a width dimension of the ceramic capacitor.

17. The ceramic capacitor according to claim 16, wherein
the first, second, third and fourth portions cover ridges of the main capacitor body including the first end surface and each of the first and second principal surfaces and first and second side surfaces; and
the fifth, sixth, seventh and eighth portions cover ridges of the main capacitor body including the second end surface and each of the first and second principal surfaces and first and second side surfaces.

18. A ceramic capacitor comprising:
a capacitor main body including first and second principal surfaces extending in a length direction and a width direction perpendicular or substantially perpendicular to the length direction, first and second side surfaces extending in the length direction and a laminating direction perpendicular or substantially perpendicular to each of the length direction and the width direction, and first and second end surfaces extending in the width direction and the laminating direction;
a plurality of internal electrodes disposed in the capacitor main body, and exposed at each of the first and second side surfaces; and
a plurality of external electrodes extending from exposed portions of the internal electrodes at the first side surface and exposed portions of the internal electrodes at the second side surface to the first and second principal surfaces; wherein
each of the plurality of internal electrodes includes:
a first internal electrode; and
a second internal electrode opposed to the first internal electrode in the laminating direction;
the first internal electrode includes:
a first opposed portion opposed to the second internal electrode;
first and second extended portions connected to the first opposed portion, and each extended to the first side surface; and
third and fourth extended portions connected to the first opposed portion, and each extended to the second side surface;
the second internal electrode includes:
a second opposed portion opposed to the first opposed portion;
a fifth extended portion connected to the second opposed portion, and extended to the first side surface; and
a sixth extended portion connected to the second opposed portion, and extended to the second side surface;
each of the plurality of external electrodes includes:
a first external electrode covering an exposed portion of the first extended portion at the first side surface and an exposed portion of the third extended portion at the second side surface, and wrapping around the first side surface, the first principal surface, the second side surface, and the second principal surface;
a second external electrode covering an exposed portion of the second extended portion at the first side surface and an exposed portion of the fourth extended portion at the second side surface, and wrapping around the first side surface, the first principal surface, the second side surface, and the second principal surface; and
a third external electrode covering an exposed portion of the fifth extended portion at the first side surface and an exposed portion of the sixth extended portion at the second side surface, and wrapping around the first side surface, the first principal surface, the second side surface, and the second principal surface; wherein
each of the first, second and third external electrodes includes a sputtered electrode film that is in direct contact with the capacitor main body;
each of outermost layers of the first, second and third external electrodes contains Cu;
the first external electrode includes:
a first portion extending from a portion located on the first principal surface to a portion of the first end surface;
a second portion extending from a portion located on the second principal surface to a portion of the first end surface;
a third portion extending from a portion located on the first side surface to a portion of the first end surface; and
a fourth portion extending from a portion located on the second side surface to a portion of the first end surface, and
the second external electrode includes:
a fifth portion extending from a portion located on the first principal surface to a portion of the second end surface;
a sixth portion extending from a portion located on the second principal surface to a portion of the second end surface;
a seventh portion extending from a portion located on the first side surface to a portion of the second end surface; and
an eighth portion extending from a portion located on the second side surface to a portion of the second end surface; and respective lengths of the first, second, fifth, and sixth portions in the laminating direction are smaller than lengths of the third, fourth, seventh, and eighth portions in the width direction.

19. The ceramic capacitor according to claim 18, wherein
the first, second, third and fourth portions cover ridges of the main capacitor body including the first end surface and each of the first and second principal surfaces and first and second side surfaces; and
the fifth, sixth, seventh and eighth portions cover ridges of the main capacitor body including the second end surface and each of the first and second principal surfaces and first and second side surfaces.

* * * * *